United States Patent
Sinha et al.

(10) Patent No.: US 8,773,210 B2
(45) Date of Patent: Jul. 8, 2014

(54) RELAXATION OSCILLATOR

(71) Applicant: Freescale Semiconductor, Inc., Austin, TX (US)

(72) Inventors: Anand Kumar Sinha, Noida (IN); Sanjay K. Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 132 days.

(21) Appl. No.: 13/665,903

(22) Filed: Oct. 31, 2012

(65) Prior Publication Data

US 2014/0118078 A1  May 1, 2014

(51) Int. Cl.
*H03K 3/0231* (2006.01)
*H03K 4/501* (2006.01)

(52) U.S. Cl.
CPC .............. *H03K 3/0231* (2013.01); *H03K 4/501* (2013.01)
USPC .......................................... 331/111; 331/143

(58) Field of Classification Search
CPC ....... H03K 3/0231; H03K 3/354; H03K 4/50; H03K 4/501; H03K 4/502
USPC .................................................. 331/111, 143
See application file for complete search history.

(56) References Cited

U.S. PATENT DOCUMENTS

| | | | |
|---|---|---|---|
| 5,760,655 A * | 6/1998 | Roohparvar | 331/111 |
| 6,163,225 A * | 12/2000 | Sundaram et al. | 331/57 |
| 6,917,249 B1 | 7/2005 | Kuo | |
| 7,109,804 B2 | 9/2006 | Mader | |
| 7,443,254 B2 | 10/2008 | Gong | |
| 7,612,623 B2 | 11/2009 | Lim | |
| 7,733,191 B2 | 6/2010 | Olmos | |
| 8,085,102 B2 * | 12/2011 | Muller | 331/111 |
| 2010/0176892 A1 * | 7/2010 | Thompson et al. | 331/111 |
| 2013/0335156 A1 * | 12/2013 | Couleur et al. | 331/111 |

* cited by examiner

Primary Examiner — Ryan Johnson
(74) Attorney, Agent, or Firm — Charles Bergere

(57) ABSTRACT

A relaxation oscillator for generating an output clock signal includes a RC circuit, a bias generation stage, first and second comparator stages, and a logic circuit. The RC circuit generates first and second comparator input signals that are transmitted to the first and second comparator stages. The bias generation stage generates first and second bias voltages that are provided to each of the first and second comparator stages. The first and second comparator stages generate first and second comparator output signals, respectively, based on the first and second comparator input signals and the first and second bias voltages. The first and second comparator output signals are provided to the logic circuit that generates the output clock signal.

18 Claims, 2 Drawing Sheets

RELAXATION OSCILLATOR

BACKGROUND OF THE INVENTION

The present invention generally relates to relaxation oscillators, and, more particularly, to a relaxation oscillator with reduced area and power consumption.

Relaxation oscillators are widely used in modern electronic systems including radio, telecommunications, and computers for generating oscillator signals. The oscillator signals are required to meet timing critical requirements such as modulation and demodulation of message signals and synchronous operation of electronic circuits. A conventional relaxation oscillator includes a resistor-capacitor (RC) circuit (connected to a power supply), first and second comparators, and a logic circuit. The RC circuit includes a resistor and first and second capacitors. The first and second capacitors are connected to the first and second comparators to provide first and second capacitor voltages to negative terminals of the first and second comparators, respectively. The first and second comparators also receive a threshold voltage generated by a resistor divider circuit or receive a bandgap voltage generated by a voltage source. The first and second capacitors are alternately charged by the power supply by way of the resistor. When a first capacitor voltage reaches the threshold voltage, the corresponding comparator that receives the first capacitor voltage trips and causes a transition in an output signal generated by the comparator. Thereafter, the first capacitor discharges to ground and the second capacitor is charged. After, a second capacitor voltage reaches the threshold voltage, the corresponding comparator that receives the second capacitor voltage trips and causes a transition in an output signal generated by the comparator. The second capacitor discharges to ground and the first capacitor is charged and the process repeats continuously. The logic circuit is connected to the outputs of the first and second comparators and generates an oscillator signal based on transitions in output signals generated by the first and second comparators.

The first and second comparators require a current source to operate which considerably occupies silicon area and increases the area and power consumed by a system-on-a-chip (SoC) on which the relaxation oscillator is integrated. Additionally, propagation delays of the first and second comparators vary substantially across various process corners and lead to variations in the frequency of the oscillator signal which deteriorates the fidelity of the oscillator signal.

Therefore, it would be advantageous to have a relaxation oscillator that has a low frequency spread across low supply voltage and process corners, that operates without a current source and consumes less power, and that overcomes the above-mentioned limitations of existing relaxation oscillators.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
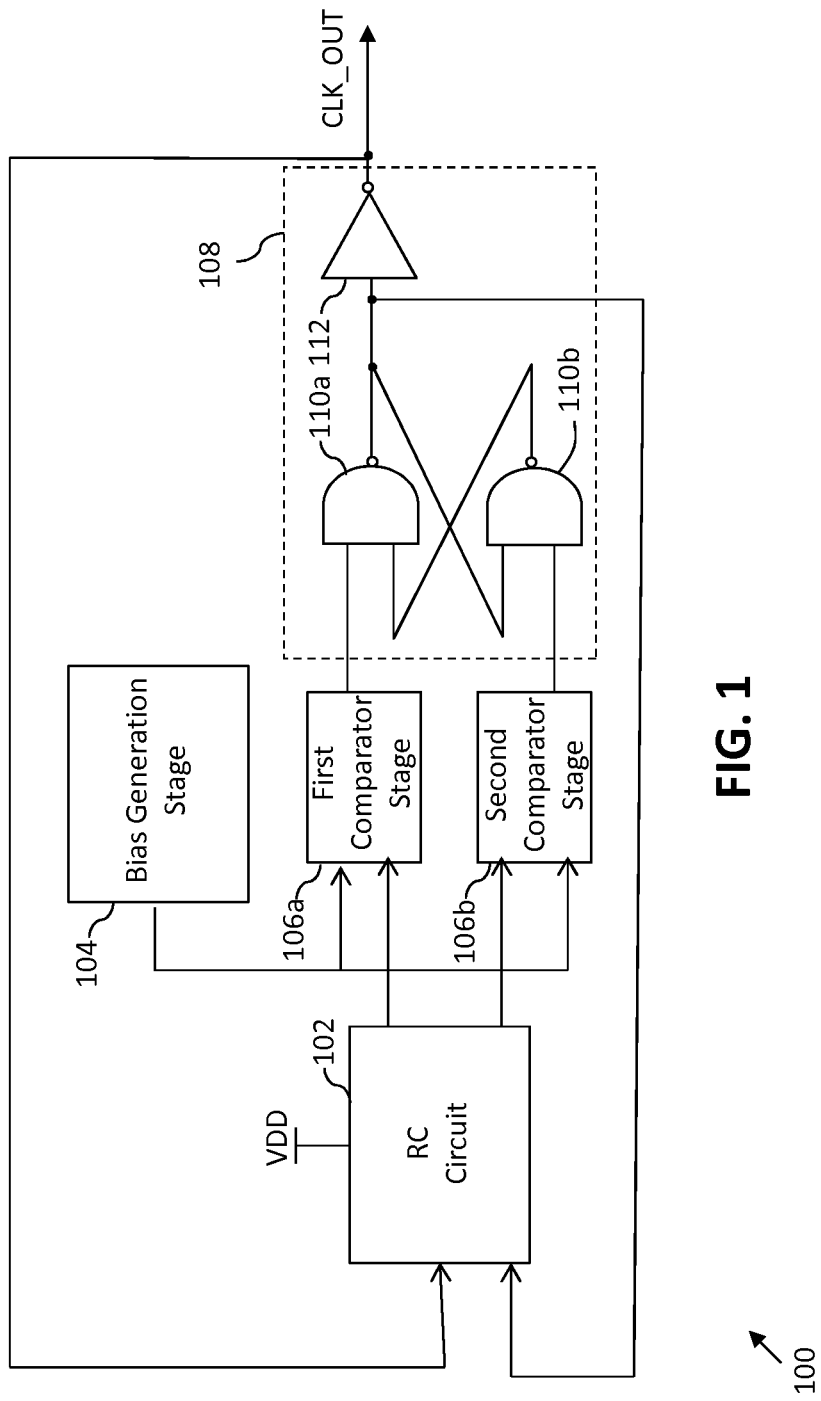
FIG. 1 is a schematic block diagram of a relaxation oscillator, in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a relaxation oscillator for generating an output clock signal is provided. The relaxation oscillator includes a resistor-capacitor (RC) circuit for generating first and second comparator input signals and a bias generation stage for generating first and second bias voltages. The bias generation stage includes: a reference voltage generator for generating a reference voltage using a supply voltage; a first transistor having a source terminal for receiving the supply voltage; a second transistor having a source terminal connected to a drain terminal of the first transistor, a gate terminal for receiving the reference voltage, and a drain terminal connected to a gate terminal of the first transistor for generating the first bias voltage; a third transistor having a drain terminal connected to the drain terminal of the second transistor, and a gate terminal for receiving the reference voltage; a first resistor having a first terminal connected to a source terminal of the third transistor and a second terminal connected to ground; a second resistor having a first terminal for receiving the supply voltage; a fourth transistor having a source terminal connected to a second terminal of the second resistor, a gate terminal for receiving the reference voltage, and a drain terminal for generating the second bias voltage; a fifth transistor having a drain terminal connected to the drain terminal of the fourth transistor, and a gate terminal for receiving the reference voltage; and a sixth transistor having a drain terminal connected to a source terminal of the fifth transistor, a gate terminal connected to the drain terminals of the fourth and fifth transistors, and a source terminal connected to ground.

A first comparator stage is connected to the RC circuit and generates a first comparator output signal based on the first comparator input signal. Further, a second comparator stage is connected to the RC circuit and generates a second comparator output signal based on the second comparator input signal. A logic circuit receives the first and second comparator output signals and generates a first intermediate signal and the output clock signal.

In another embodiment of the present invention, a relaxation oscillator for generating an output clock signal is provided. The relaxation oscillator includes a RC circuit for generating first and second comparator input signals and a bias generation stage for generating first and second bias voltages. A first comparator stage is connected to the RC circuit and generates a first comparator output signal based on the first comparator input signal and includes: a first transistor having a source terminal for receiving a supply voltage, and a gate terminal for receiving the first bias voltage; a second transistor having a source terminal connected to a drain terminal of the first transistor, a gate terminal for receiving the first comparator input signal, and a drain terminal for generating a first comparison signal; a third transistor having a drain terminal connected to the drain terminal of the second transistor, and a gate terminal connected to the gate terminal of the second transistor for receiving the first comparator input signal; a first resistor having a first terminal connected to a source terminal of the third transistor and a second terminal connected to ground; a first inverter having an input connected to the drain terminals of the second and third transistors and receiving the first comparison signal, and an output that provides an inverted first comparison signal; a second resistor having a first terminal for receiving the supply voltage; a fourth transistor having a source terminal connected to a second terminal of the second resistor, a gate terminal for receiving the first comparator input signal, and a drain terminal for generating a second comparison signal; a fifth transistor having a drain terminal connected to the drain terminal of the fourth transistor, and a gate terminal for receiving the first comparator input signal; a sixth transistor having a drain terminal connected to a source terminal of the fifth transistor, a gate terminal for receiving the second bias voltage, and a source terminal connected to ground; a second inverter having an input connected to the drain terminals of the fourth and fifth transistors and receiving the second comparison signal, and an output that provides an inverted second comparison signal; and a third inverter having an input connected to the outputs of the first and second inverters and receiving the inverted first and second comparison signals, and an output that provides the first comparator output signal.

A second comparator stage is connected to the RC circuit and generates a second comparator output signal based on the second comparator input signal. A logic circuit receives the first and second comparator output signals and generates a first intermediate signal and the output clock signal.

In yet another embodiment of the present invention, a relaxation oscillator for generating an output clock signal is provided. The relaxation oscillator includes a RC circuit for generating first and second comparator input signals and a bias generation stage for generating first and second bias voltages. The bias generation stage includes: a reference voltage generator for generating a reference voltage using a supply voltage; a first transistor having a source terminal for receiving the supply voltage; a second transistor having a source terminal connected to a drain terminal of the first transistor, a gate terminal for receiving the reference voltage, and a drain terminal connected to a gate terminal of the first transistor for generating the first bias voltage; a third transistor having a drain terminal connected to the drain terminal of the second transistor, and a gate terminal for receiving the reference voltage; a first resistor having a first terminal connected to a source terminal of the third transistor and a second terminal connected to ground; a second resistor having a first terminal for receiving the supply voltage; a fourth transistor having a source terminal connected to a second terminal of the second resistor, a gate terminal for receiving the reference voltage, and a drain terminal for generating the second bias voltage; a fifth transistor having a drain terminal connected to the drain terminal of the fourth transistor, and a gate terminal for receiving the reference voltage; and a sixth transistor having a drain terminal connected to a source terminal of the fifth transistor, a gate terminal connected to the drain terminals of the fourth and fifth transistors, and a source terminal connected to ground.

A first comparator stage is connected to the RC circuit and generates a first comparator output signal based on the first comparator input signal and includes: a seventh transistor having a source terminal for receiving the supply voltage, and a gate terminal for receiving the first bias voltage; an eighth transistor having a source terminal connected to a drain terminal of the seventh transistor, a gate terminal for receiving the first comparator input signal, and a drain terminal for generating a first comparison signal; a ninth transistor having a drain terminal connected to the drain terminal of the eighth transistor, and a gate terminal connected to the gate terminal of the eighth transistor for receiving the first comparator input signal; a third resistor having a first terminal connected to a source terminal of the ninth transistor and a second terminal connected to ground; a first inverter having an input connected to the drain terminals of the eighth and ninth transistors and receiving the first comparison signal, and an output that provides an inverted first comparison signal; a fourth resistor having a first terminal for receiving the supply voltage; a tenth transistor having a source terminal connected to a second terminal of the fourth resistor, a gate terminal for receiving the first comparator input signal, and a drain terminal for generating a second comparison signal; an eleventh transistor having a drain terminal connected to the drain terminal of the tenth transistor, and a gate terminal for receiving the first comparator input signal; a twelfth transistor having a drain terminal connected to a source terminal of the eleventh transistor, a gate terminal for receiving the second bias voltage, and a source terminal connected to ground; a second inverter having an input connected to the drain terminals of the tenth and eleventh transistors and receiving the second comparison signal, and an output that provides an inverted second comparison signal; and a third inverter having an input connected to the outputs of the first and second inverters and receiving the inverted first and second comparison signals, and an output that provides the first comparator output signal.

A second comparator stage is connected to the RC circuit and generates a second comparator output signal based on the second comparator input signal and includes: a thirteenth transistor having a source terminal for receiving the supply voltage, and a gate terminal for receiving the first bias voltage; a fourteenth transistor having a source terminal connected to a drain terminal of the thirteenth transistor, a gate terminal for receiving the second comparator input signal, and a drain terminal for generating a third comparison signal; a fifteenth transistor having a drain terminal connected to the drain terminal of the fourteenth transistor, and a gate terminal connected to the gate terminal of the fourteenth transistor for receiving the second comparator input signal; a fifth resistor having a first terminal connected to a source terminal of the fifteenth transistor and a second terminal connected to ground; a fourth inverter having an input connected to the drain terminals of the fourteenth and fifteenth transistors and receiving the third comparison signal, and an output that provides an inverted third comparison signal; a sixth resistor having a first terminal for receiving the supply voltage; a sixteenth transistor having a source terminal connected to a second terminal of the sixth resistor, a gate terminal for receiving the second comparator input signal, and a drain terminal for generating a fourth comparison signal; a seventeenth transistor having a drain terminal connected to the drain terminal of the sixteenth transistor, and a gate terminal for receiving the second comparator input signal; an eighteenth transistor having a drain terminal connected to a source terminal of the seventeenth transistor, a gate terminal for receiving the second bias voltage, and a source terminal connected to ground; a fifth inverter having an input connected to the drain terminals of the sixteenth and seventeenth transistors and receiving the fourth comparison signal, and an output that provides an inverted fourth comparison signal; and a sixth inverter having an input connected to the outputs of the fourth and fifth inverters and receiving the inverted third and fourth comparison signals, and an output that provides the second comparator output signal.

A logic circuit receives the first and second comparator output signals and generates a first intermediate signal and the output clock signal.

Various embodiments of the present invention provide a relaxation oscillator that includes a resistor-capacitor (RC) circuit, a bias generation stage, and first and second comparator stages. The first and second comparator stages are inverter-comparator stages and do not require a separate current source for functioning, which reduces silicon area and current consumption of the system-on-chip (SoC) on which the relaxation oscillator is integrated and further eliminates efforts required for designing a separate current source. The bias generation stage generates first and second bias voltages (pbias and nbias), for each of the first and second comparator stages by using a negative feedback action imposed by p-channel metal oxide semiconductor (PMOS) and n-channel metal oxide semiconductor (NMOS) transistors, respectively. The negative feedback ensures that the first and second bias voltages (pbias and nbias) vary to ensure that trip points of the first and second comparator stages are independent of process and temperature variations. Additionally, each comparator stage is sub-divided into two stages designed using first and second bias voltages (pbias and nbias) generated by PMOS and NMOS transistors. The PMOS and NMOS transistors provide negative feedback and ensure smooth and consistent transitions in an output signal generated by each comparator stage at a predetermined threshold voltage and across various process and temperature corners and ensure a low frequency spread across various process and temperature corners.

Referring now to FIG. 1, a schematic block diagram of a relaxation oscillator 100, in accordance with an embodiment of the present invention, is shown. The relaxation oscillator 100 includes an RC circuit 102, a bias generation stage 104, first and second comparator stages 106a and 106b, and a logic circuit 108. The logic circuit 108 includes first and second NAND gates 110a and 110b, and a NOT gate 112.

The RC circuit 102 is realized using first and second capacitors (not shown) connected to a power supply $V_{DD}$ by way of a resistor (not shown), respectively, as known to those skilled in the art. The first and second capacitors are charged by the power supply $V_{DD}$ by way of the resistor. The RC circuit 102 generates first and second comparator input signals that are provided to the first and second comparator stages 106a and 106b, respectively. The bias generation stage 104 generates first and second bias voltages (pbias and nbias) that are provided to each of the first and second comparator stages 106a and 106b. In an embodiment of the present invention, the first and second comparator stages 106a and 106b include inverter-comparators (shown in FIG. 3) and do not require a dedicated current source for operation. Further, the first and second bias voltages (pbias and nbias) have magnitudes that vary across process and temperature and ensure that threshold voltages or trip points of the first and second comparator stages 106a and 106b remain independent of process and temperature variations.

The first and second comparator stages 106a and 106b generate first and second comparator output signals that are provided to the logic circuit 108. The first and second comparator output signals are received at first input terminals of the first and second NAND gates 110a and 110b, respectively. A second input terminal of the first NAND gate 110a is connected to an output terminal of the second NAND gate 110b, and an output terminal of the first NAND gate 110a is connected to the NOT gate 112 and the RC circuit 102. The first NAND gate 110a receives a second intermediate signal at the second input terminal and generates a first intermediate signal at the output terminal based on the first comparator output signal and the second intermediate signal. The first NAND gate 110a transmits the first intermediate signal to the RC circuit 102 and to the NOT gate 112. A second input terminal of the second NAND gate 110b is connected to the output terminal of the first NAND gate 110a for receiving the first intermediate signal. The second NAND gate 110b generates the second intermediate signal based on the second comparator output and first intermediate signals. Further, the NOT gate 112 inverts the first intermediate signal to generate an output clock signal (CLK_OUT) at an output terminal. The output terminal of the NOT gate 112 is connected to the RC circuit 102 for transmitting the output clock signal CLK_OUT to the RC circuit 102. The first intermediate signal and the output clock signal CLK_OUT are used to generate a control signal for charging the first and second capacitors (not shown) by way of the resistor (not shown) of the RC circuit 102, using the power supply $V_{DD}$.

Figures 2, 3:
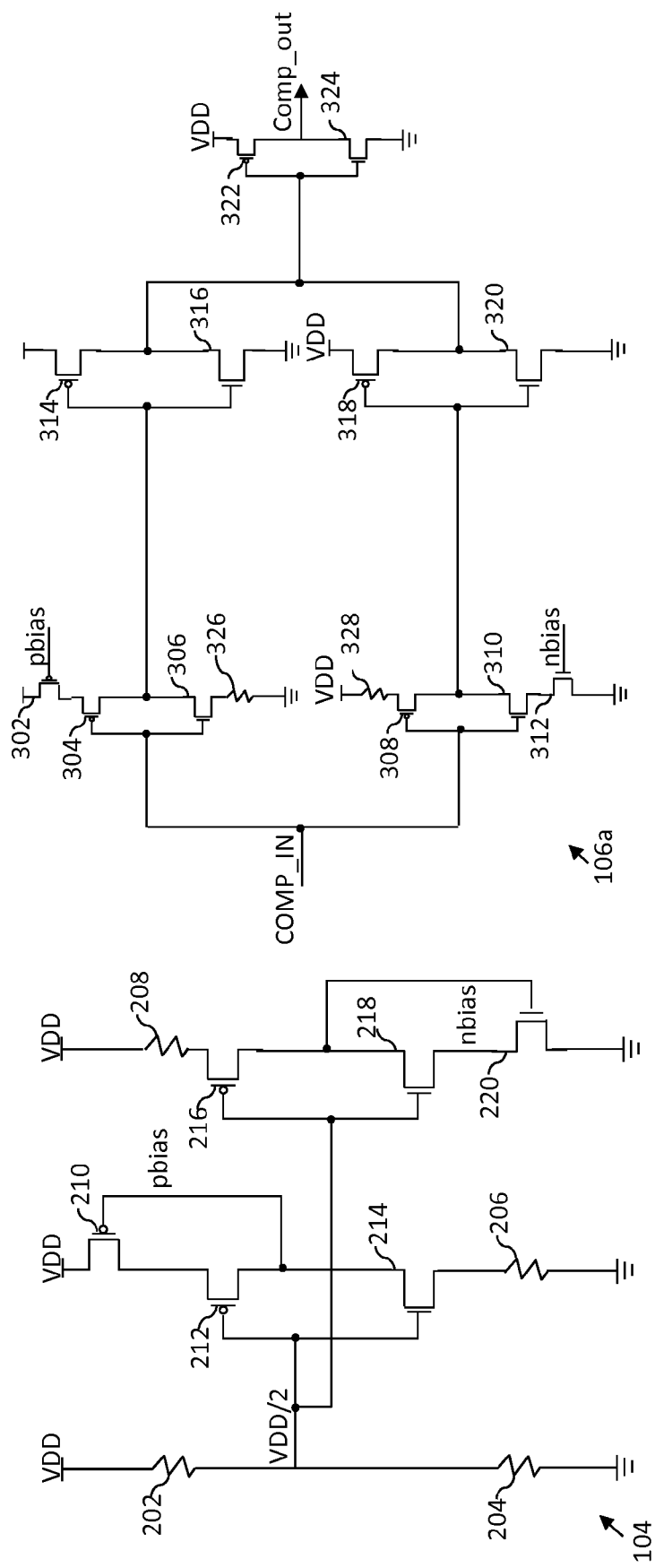
FIG. 2 is a schematic circuit diagram of a bias generation stage of the relaxation oscillator of FIG. 1, in accordance with an embodiment of the present invention.
FIG. 3 is a schematic circuit diagram of a first comparator stage of the relaxation oscillator of FIG. 1, in accordance with an embodiment of the present invention.

Referring now to FIG. 2, a schematic circuit diagram of the bias generation stage 104, in accordance with an embodiment of the present invention, is shown. The bias generation stage 104 includes four resistors (first through fourth resistors) 202-208 and six transistors (first through sixth transistors) 210-220.

A first terminal of the first resistor 202 is connected to the power supply $V_{DD}$ and a second terminal thereof is connected to a first terminal of the second resistor 204. A second terminal of the second resistor 204 is connected to ground. A source terminal of the first transistor 210 is connected to the power supply $V_{DD}$ and a drain terminal thereof is connected to a source terminal of the second transistor 212. A gate terminal of the second transistor 212 is connected to the second and first terminals of the first and second resistors 202 and 204, respectively. A drain terminal of the second transistor 212 is connected to a gate terminal of the first transistor 210 and to a drain terminal of the third transistor 214. A gate terminal of the third transistor 214 is connected to the gate terminal of the second transistor 212 and a source terminal thereof is connected to a first terminal of the third resistor 206. A second terminal of the third resistor 206 is connected to ground.

A first terminal of the fourth resistor 208 is connected to the power supply $V_{DD}$ and a second terminal thereof is connected to a source terminal of the fourth transistor 216. A gate terminal of the fourth transistor 216 is connected to the second and first terminals of the first and second resistors 202 and 204, respectively. A drain terminal of the fourth transistor 216 is connected to a drain terminal of the fifth transistor 218. A gate terminal of the fifth transistor 218 is connected to the gate terminal of the fourth transistor 216 and a source terminal of the fifth transistor 218 is connected to a drain terminal of the sixth transistor 220. A gate terminal of the sixth transistor 220 is connected to the drain terminals of the fourth and fifth transistors 216 and 218 and a source terminal of the sixth transistor 220 is connected to ground.

The first and second resistors 202 and 204 are connected in a potential-divider configuration to form a reference voltage generator that generates a reference voltage ($V_{DD}/2$). The reference voltage ($V_{DD}/2$) is provided to a first inverter-comparator bias stage that is formed with two p-type metal oxide semiconductor (PMOS) transistors connected to a n-type MOS (NMOS) transistor and a resistor. More particularly, the reference voltage ($V_{DD}/2$) is provided at the gate terminals of the second and third transistors 212 and 214, in which the second transistor 212 is connected to the first transistor 210 and the third transistor 214 is connected to the third resistor 206 to form the first inverter-comparator bias stage. The first inverter-comparator bias stage generates the first bias voltage (pbias) at the drain terminals of the second and third transistors 212 and 214. In an example, the bias generation stage 104 generates the first bias voltage (pbias) having a magnitude that tunes a threshold voltage of a first portion of the first comparator stage 106a (shown in FIG. 1) to $V_{DD}/2$. Due to process and temperature variations and/or the power supply $V_{DD}$ variation, threshold voltages and resistances of the first through third transistors 210-214 may vary. As a result a negative feedback action is initiated that modifies the first bias voltage (pbias) until the threshold voltage of the first portion of the first comparator stage 106a is tuned to $V_{DD}/2$.

The reference voltage $V_{DD}/2$ is also provided to a second inverter-comparator bias stage formed by the fourth through sixth transistors 216-220 and the fourth resistor 208. The reference voltage $V_{DD}/2$ is received at the gate terminals of the fourth and fifth transistors 216 and 218 which act as inputs of the second inverter-comparator bias stage. The second inverter-comparator bias stage generates the second bias voltage (nbias) at the drain terminals of the fourth and fifth transistors 216 and 218. In an example, the bias generation stage 104 generates the second bias voltage (nbias) having a magnitude that tunes a threshold voltage of a second portion of the first comparator stage 106a (shown in FIG. 1) to $V_{DD}/2$. Due to process and temperature variations and/or the power supply $V_{DD}$ variation, threshold voltages and resistances of the fourth through sixth transistors 216-220 may vary. As a result a negative feedback action is initiated that continues to modify the second bias voltage (nbias) until the threshold voltage of the second portion of the first comparator stage 106a is tuned to $V_{DD}/2$. In an embodiment of the present invention, the first, second, fourth transistors 210, 212, and 216 are PMOS transistors and the third, fifth, and sixth transistors 214, 218, and 220 are NMOS transistors. The bias generation stage 104 generates the first and second bias voltages (pbias and nbias) using the negative feedback action imposed by PMOS (the first transistor 210) and NMOS (the sixth transistor 220) transistors that varies the first and second bias voltages (pbias and nbias), respectively, and maintains the threshold voltage of the first and second portions of the first comparator stage 106a to at $V_{DD}/2$ independent of the process and temperature variations and/or supply $V_{DD}$ variation.

Referring now to FIG. 3, a schematic circuit diagram of the first comparator stage 106a, in accordance with an embodiment of the present invention, is shown. The first comparator stage 106a includes twelve transistors (seventh through eighteenth transistors) 302-324, and two resistors (fifth and sixth resistors) 326 and 328.

A source terminal of the seventh transistor 302 is connected to the power supply $V_{DD}$, a drain terminal thereof is connected to a source terminal of the eighth transistor 304, and a gate terminal thereof is connected to the bias generation stage 104 for receiving the first bias voltage (pbias). A gate terminal of the eighth transistor 304 is connected to the RC circuit 102 and a drain terminal thereof is connected to a drain terminal of the ninth transistor 306. A gate terminal of the ninth transistor 306 is connected to the gate terminal of the eighth transistor 304 and a source terminal thereof is connected to a first terminal of the fifth resistor 326. A second terminal of the fifth resistor 326 is to ground potential. The seventh through ninth transistors 302-306 and the fifth resistor 326 form the first portion of the first comparator stage 106a.

A first terminal of the sixth resistor 328 is connected to the power supply $V_{DD}$ and a second terminal thereof is connected to a source terminal of the tenth transistor 308. A gate terminal of the tenth transistor 308 is connected to the RC circuit 102 and a drain terminal of the tenth transistor 308 is connected to a drain terminal of the eleventh transistor 310. A gate terminal of the eleventh transistor 310 is connected to the gate terminal of the tenth transistor 308 and a source terminal of the eleventh transistor 310 is connected to a drain terminal of the twelfth transistor 312. A gate terminal of the twelfth transistor 312 is connected to the bias generation stage 104 for receiving the second bias voltage (nbias). The tenth through twelfth transistors 308-312 and the sixth resistor 328 form the second portion of the first comparator stage 106a.

A source terminal of the thirteenth transistor 314 is connected to the power supply $V_{DD}$, a gate terminal thereof is connected to the drain terminals of the eighth and ninth transistors 304 and 306, and a drain terminal thereof is connected to a drain terminal of the fourteenth transistor 316. A gate terminal of the fourteenth transistor 316 is connected to the gate terminal of the thirteenth transistor 314 and a source terminal thereof is at ground potential. A source terminal of the fifteenth transistor 318 is connected to the power supply $V_{DD}$, a gate terminal thereof is connected to the drain terminals of the tenth and eleventh transistors 308 and 310, and a drain terminal thereof is connected to a drain terminal of the sixteenth transistor 320. A gate terminal of the sixteenth transistor 320 is connected to the gate terminal of the fifteenth transistor 318 and a source terminal thereof is at ground potential.

A source terminal of the seventeenth transistor 322 is connected to the power supply $V_{DD}$, a gate terminal thereof is connected to the drain terminals of the thirteenth and fifteenth transistors 314 and 318, and a drain terminal thereof is connected to a drain terminal of the eighteenth transistor 324. A gate terminal of the eighteenth transistor 324 is connected to the gate terminal of the seventeenth transistor 322 and a source terminal thereof is at ground potential.

The first comparator input signal (COMP_IN) is provided to a first inverter-comparator formed by the seventh through ninth transistors 302-306 and the fifth resistor 326. The first comparator input signal (COMP_IN) is received at the gate terminals of the eighth and ninth transistors 304 and 306 which act as inputs of the first inverter-comparator. The first inverter-comparator generates a first comparison signal at the drain terminals of the eighth and ninth transistors 304 and 306 based on the first comparator input signal. The first bias voltage (pbias) provided at the gate terminal of the seventh transistor 302 tunes a threshold voltage of the first inverter-comparator at $V_{DD}/2$ and causes the first inverter-comparator to trip when a magnitude of the first comparator input signal (COMP_IN) equals $V_{DD}/2$. The first comparison signal is transmitted to a first inverter formed by the thirteenth and fourteenth transistors 314 and 316 in a manner known to those skilled in the art. The first comparison signal is received at the gate terminals of the thirteenth and fourteenth transistors 314 and 316 which act as inputs of the first inverter. The first inverter inverts the first comparison signal to generate an inverted first comparison signal at the drain terminals of the thirteenth and fourteenth transistors 314 and 316. The inverted first comparison signal is transmitted to a second inverter formed by the seventeenth and eighteenth transistors 322 and 324. The inverted first comparison signal is received at the gate terminals of the seventeenth and eighteenth transistors 322 and 324 which are the input of the second inverter.

The first comparator input signal (COMP_IN) is also provided to a second inverter-comparator formed by the tenth through twelfth transistors 308-312 and the sixth resistor 328. The gate terminals of the tenth and eleventh transistors 308 and 310, which are the input of the second inverter-comparator, receive the first comparator input signal (COMP_IN). The second inverter-comparator generates a second comparison signal based on the first comparator input signal. The second bias voltage (nbias) provided at the gate terminal of the twelfth transistor 312 tunes a threshold voltage of the second inverter-comparator at $V_{DD}/2$, thereby causing it to trip when the magnitude of the first comparator input signal (COMP_IN) equals VDD/2. The second comparison signal is transmitted to a third inverter formed by the fifteenth and sixteenth transistors 318 and 320. The second comparison signal is received at the gate terminals of the fifteenth and sixteenth transistors 318 and 320 which act as inputs of the third inverter. The third inverter inverts the second comparison signal to generate an inverted second comparison signal at the drain terminals of the fifteenth and sixteenth transistors 318 and 320. The inverted second comparison signal is transmitted to the input of the second inverter, i.e., the gate terminals of the seventeenth and eighteenth transistors 322 and 324. The inverted first and second comparison signals are combined at the gate terminals of the seventeenth and eighteenth transistors 322 and 324. The second inverter inverts the combined, inverted first and second comparison signals to generate the first comparator output signal.

In an embodiment of the present invention, the seventh, eighth, tenth, thirteenth, fifteenth, and seventeenth transistors 302, 304, 308, 314, 318, and 322 respectively, are PMOS transistors and the ninth, eleventh, twelfth, fourteenth, sixteenth, and eighteenth transistors 306, 310, 312, 316, 320, and 324, respectively, are NMOS transistors.

The second comparator stage 106b is identical to the first comparator stage 106a and includes nineteenth through thirtieth transistors (not shown) that correspond to seventh through eighteenth transistors 302-324 and seventh and eight resistors (not shown) that correspond to fifth and sixth resistors 326 and 328 of the first comparator stage 106a. The second comparator stage 106b receives the second comparator input signal and the first and second bias voltages (pbias and nbias). The second comparator stage 106b generates the second comparator output signal in a manner similar to that of the first comparator stage 106a.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A relaxation oscillator for generating an output clock signal, comprising:
   a resistor-capacitor (RC) circuit for generating first and second comparator input signals;
   a bias generation stage for generating first and second bias voltages, including:
      a reference voltage generator for generating the reference voltage using a supply voltage;
      a first transistor having a source terminal for receiving the supply voltage;
      a second transistor having a source terminal connected to a drain terminal of the first transistor, a gate terminal for receiving the reference voltage, and a drain terminal connected to a gate terminal of the first transistor for generating the first bias voltage;
      a third transistor having a drain terminal connected to the drain terminal of the second transistor, and a gate terminal for receiving the reference voltage;
      a first resistor having a first terminal connected to a source terminal of the third transistor and a second terminal connected to ground;
      a second resistor having a first terminal for receiving the supply voltage;
      a fourth transistor having a source terminal connected to a second terminal of the second resistor, a gate terminal for receiving the reference voltage, and a drain terminal for generating the second bias voltage;
      a fifth transistor having a drain terminal connected to the drain terminal of the fourth transistor, and a gate terminal for receiving the reference voltage; and
      a sixth transistor having a drain terminal connected to a source terminal of the fifth transistor, a gate terminal connected to the drain terminals of the fourth and fifth transistors, and a source terminal connected to ground;
   a first comparator stage, connected to the RC circuit and the bias generation stage, for receiving the first comparator input signal and the first and second bias voltages and generating a first comparator output signal;
   a second comparator stage, connected to the RC circuit and the bias generation stage, for receiving the second comparator input signal and the first and second bias voltages and generating a second comparator output signal; and
   a logic circuit that receives the first and second comparator output signals and generates a first intermediate signal and the output clock signal.

2. The relaxation oscillator of claim 1, wherein the logic circuit comprises:
   a first NAND gate having a first input terminal connected to an output terminal of the first comparator stage for receiving the first comparator output signal, a second input terminal for receiving a second intermediate signal, and an output terminal connected to the RC circuit, wherein the first NAND gate generates the first intermediate signal at the output terminal thereof and transmits the first intermediate signal to the RC circuit;
   a second NAND gate having a first input terminal connected to an output terminal of the second comparator stage for receiving the second comparator output signal, a second input terminal connected to the output terminal of the first NAND gate for receiving the first intermediate signal, wherein the second NAND gate generates the second intermediate signal at an output terminal thereof; and
   a NOT gate having an input terminal connected to the output terminal of the first NAND gate for receiving the first intermediate signal, and an output terminal connected to the RC circuit, wherein the NOT gate generates the output clock signal at the output terminal thereof and transmits the output clock signal to the RC circuit.

3. The relaxation oscillator of claim 1, wherein the first comparator stage comprises:
   a seventh transistor having a source terminal for receiving the supply voltage, and a gate terminal for receiving the first bias voltage;
   an eighth transistor having a source terminal connected to a drain terminal of the seventh transistor, a gate terminal for receiving the first comparator input signal, and a drain terminal for generating a first comparison signal;
   a ninth transistor having a drain terminal connected to the drain terminal of the eighth transistor, and a gate terminal connected to the gate terminal of the eighth transistor for receiving the first comparator input signal;

a third resistor having a first terminal connected to a source terminal of the ninth transistor and a second terminal connected to ground;

a first inverter having an input connected to the drain terminals of the eighth and ninth transistors and receiving the first comparison signal, and an output that provides an inverted first comparison signal;

a fourth resistor having a first terminal for receiving the supply voltage;

a tenth transistor having a source terminal connected to a second terminal of the fourth resistor, a gate terminal for receiving the first comparator input signal, and a drain terminal for generating a second comparison signal;

an eleventh transistor having a drain terminal connected to the drain terminal of the tenth transistor, and a gate terminal for receiving the first comparator input signal;

a twelfth transistor having a drain terminal connected to a source terminal of the eleventh transistor, a gate terminal for receiving the second bias voltage, and a source terminal connected to ground;

a second inverter having an input connected to the drain terminals of the tenth and eleventh transistors and receiving the second comparison signal, and an output that provides an inverted second comparison signal; and a third inverter having an input connected to the outputs of the first and second inverters and receiving the inverted first and second comparison signals, and an output that provides the first comparator output signal.

4. The relaxation oscillator of claim 3, wherein the first inverter comprises:

a thirteenth transistor having a source terminal for receiving the supply voltage, a gate terminal connected to the drain terminals of the eighth and ninth transistors for receiving the first comparison signal, and a drain terminal for generating the inverted first comparison signal; and a fourteenth transistor having a drain terminal connected to the drain terminal of the thirteenth transistor, a gate terminal connected to the gate terminal of the thirteenth transistor, and a source terminal connected to ground.

5. The relaxation oscillator of claim 4, wherein the second inverter comprises:

a fifteenth transistor having a source terminal for receiving the supply voltage, a gate terminal connected to the drain terminals of the tenth and eleventh transistors for receiving the second comparison signal, and a drain terminal for generating the inverted second comparison signal; and a sixteenth transistor having a drain terminal connected to the drain terminal of the fifteenth transistor, a gate terminal connected to the gate terminal of the fifteenth transistor, and a source terminal connected to ground.

6. The relaxation oscillator of claim 5, wherein the third inverter comprises:

a seventeenth transistor having a source terminal for receiving the supply voltage, a gate terminal connected to the drain terminals of the thirteenth and fifteenth transistors for receiving the inverted first and second comparison signals, and a drain terminal for generating the first comparator output signal; and an eighteenth transistor having a drain terminal connected to the drain terminal of the seventeenth transistor, a gate terminal connected to the gate terminal of the seventeenth transistor, and a source terminal connected to ground.

7. The relaxation oscillator of claim 3, wherein the second comparator stage includes:

a thirteenth transistor having a source terminal for receiving the supply voltage, and a gate terminal for receiving the first bias voltage;

a fourteenth transistor having a source terminal connected to a drain terminal of the thirteenth transistor, a gate terminal for receiving the second comparator input signal, and a drain terminal for generating a third comparison signal;

a fifteenth transistor having a drain terminal connected to the drain terminal of the fourteenth transistor, and a gate terminal connected to the gate terminal of the fourteenth transistor for receiving the second comparator input signal;

a fifth resistor having a first terminal connected to a source terminal of the fifteenth transistor and a second terminal connected to ground;

a fourth inverter having an input connected to the drain terminals of the fourteenth and fifteenth transistors and receiving the third comparison signal, and an output that provides an inverted third comparison signal;

a sixth resistor having a first terminal for receiving the supply voltage;

a sixteenth transistor having a source terminal connected to a second terminal of the sixth resistor, a gate terminal for receiving the second comparator input signal, and a drain terminal for generating a fourth comparison signal;

a seventeenth transistor having a drain terminal connected to the drain terminal of the sixteenth transistor, and a gate terminal for receiving the second comparator input signal;

an eighteenth transistor having a drain terminal connected to a source terminal of the seventeenth transistor, a gate terminal for receiving the second bias voltage, and a source terminal connected to ground;

a fifth inverter having an input connected to the drain terminals of the sixteenth and seventeenth transistors and receiving the fourth comparison signal, and an output that provides an inverted fourth comparison signal; and a sixth inverter having an input connected to the outputs of the fourth and fifth inverters and receiving the inverted third and fourth comparison signals, and an output that provides the second comparator output signal.

8. The relaxation oscillator of claim 7, wherein the fourth inverter comprises:

a nineteenth transistor having a source terminal for receiving the supply voltage, a gate terminal connected to the drain terminals of the fourteenth and fifteenth transistors for receiving the third comparison signal, and a drain terminal for generating the inverted third comparison signal; and a twentieth transistor having a drain terminal connected to the drain terminal of the nineteenth transistor, a gate terminal connected to the gate terminal of the nineteenth transistor, and a source terminal connected to ground.

9. The relaxation oscillator of claim 8, wherein the fifth inverter comprises:

a twenty-first transistor having a source terminal for receiving the supply voltage, a gate terminal connected to the drain terminals of the sixteenth and seventeenth transistors for receiving the fourth comparison signal, and a drain terminal for generating an inverted fourth comparison signal; and a twenty-second transistor having a drain terminal connected to the drain terminal of the twenty-first transistor, a gate terminal connected to the gate terminal of the twenty-first transistor, and a source terminal connected to ground.

10. The relaxation oscillator of claim 9, wherein the sixth inverter comprises:
   a twenty-third transistor having a source terminal for receiving the supply voltage, a gate terminal connected to the drain terminals of the nineteenth and twenty-first transistors for receiving the inverted third and fourth comparison signals, respectively, and a drain terminal for generating the second comparator output signal; and
   a twenty-fourth transistor having a drain terminal connected to the drain terminal of the twenty-third transistor, a gate terminal connected to the gate terminal of the twenty-third transistor, and a source terminal connected to ground.

11. The relaxation oscillator of claim 10, wherein the reference voltage generator includes seventh and eighth resistors connected in a potential divider configuration.

12. A relaxation oscillator for generating an output clock signal, comprising:
   a resistor-capacitor (RC) circuit for generating first and second comparator input signals;
   a bias generation stage for generating first and second bias voltages;
   a first comparator stage, connected to the RC circuit, for generating a first comparator output signal based on the first comparator input signal, wherein the first comparator stage includes:
      a first transistor having a source terminal for receiving a supply voltage, and a gate terminal for receiving the first bias voltage;
      a second transistor having a source terminal connected to a drain terminal of the first transistor, a gate terminal for receiving the first comparator input signal, and a drain terminal for generating a first comparison signal;
      a third transistor having a drain terminal connected to the drain terminal of the second transistor, and a gate terminal connected to the gate terminal of the second transistor for receiving the first comparator input signal;
      a first resistor having a first terminal connected to a source terminal of the third transistor and a second terminal connected to ground;
      a first inverter having an input connected to the drain terminals of the second and third transistors and receiving the first comparison signal, and an output that provides an inverted first comparison signal;
      a second resistor having a first terminal for receiving the supply voltage;
      a fourth transistor having a source terminal connected to a second terminal of the second resistor, a gate terminal for receiving the first comparator input signal, and a drain terminal for generating a second comparison signal;
      a fifth transistor having a drain terminal connected to the drain terminal of the fourth transistor, and a gate terminal for receiving the first comparator input signal;
      a sixth transistor having a drain terminal connected to a source terminal of the fifth transistor, a gate terminal for receiving the second bias voltage, and a source terminal connected to ground;
      a second inverter having an input connected to the drain terminals of the fourth and fifth transistors and receiving the second comparison signal, and an output that provides an inverted second comparison signal; and
      a third inverter having an input connected to the outputs of the first and second inverters and receiving the inverted first and second comparison signals, and an output that provides the first comparator output signal;
   a second comparator stage, connected to the RC circuit, for generating a second comparator output signal based on the second comparator input signal; and
   a logic circuit that receives the first and second comparator output signals and generates a first intermediate signal and the output clock signal.

13. The relaxation oscillator of claim 12, wherein the logic circuit comprises:
   a first NAND gate having a first input terminal connected to an output terminal of the first comparator stage for receiving the first comparator output signal, a second input terminal for receiving a second intermediate signal, and an output terminal connected to the RC circuit, wherein the first NAND gate generates the first intermediate signal at the output terminal thereof and transmits the first intermediate signal to the RC circuit;
   a second NAND gate having a first input terminal connected to an output terminal of the second comparator stage for receiving the second comparator output signal, a second input terminal connected to the output terminal of the first NAND gate for receiving the first intermediate signal, wherein the second NAND gate generates the second intermediate signal at an output terminal thereof; and
   a NOT gate having an input terminal connected to the output terminal of the first NAND gate for receiving the first intermediate signal, and an output terminal connected to the RC circuit, wherein the NOT gate generates the output clock signal at the output terminal thereof and transmits the output clock signal to the RC circuit.

14. The relaxation oscillator of claim 12, wherein the bias generation stage includes:
   a reference voltage generator for generating a reference voltage using the supply voltage;
   a seventh transistor having a source terminal for receiving the supply voltage;
   an eighth transistor having a source terminal connected to a drain terminal of the seventh transistor, a gate terminal for receiving the reference voltage, and a drain terminal, connected to a gate terminal of the seventh transistor, for generating the first bias voltage;
   a ninth transistor having a drain terminal connected to the drain terminal of the eighth transistor, and a gate terminal for receiving the reference voltage;
   a third resistor having a first terminal connected to a source terminal of the ninth transistor and a second terminal connected to ground;
   a fourth resistor having a first terminal for receiving the supply voltage;
   a tenth transistor having a source terminal connected to a second terminal of the fourth resistor, a gate terminal for receiving the reference voltage, and a drain terminal for generating the second bias voltage;
   an eleventh transistor having a drain terminal connected to the drain terminal of the tenth transistor, and a gate terminal for receiving the reference voltage; and
   a twelfth transistor having a drain terminal connected to a source terminal of the eleventh transistor, a gate terminal connected to the drain terminals of the tenth and eleventh transistors, and a source terminal connected to ground.

15. The relaxation oscillator of claim 14, wherein the reference voltage generator includes fifth and sixth resistors connected in a potential divider configuration.

16. The relaxation oscillator of claim 15, wherein the second comparator stage includes:
- a thirteenth transistor having a source terminal for receiving the supply voltage, and a gate terminal for receiving the first bias voltage;
- a fourteenth transistor having a source terminal connected to a drain terminal of the thirteenth transistor, a gate terminal for receiving the second comparator input signal, and a drain terminal for generating a third comparison signal;
- a fifteenth transistor having a drain terminal connected to the drain terminal of the fourteenth transistor, and a gate terminal connected to the gate terminal of the fourteenth transistor for receiving the second comparator input signal;
- a seventh resistor having a first terminal connected to a source terminal of the fifteenth transistor and a second terminal connected to ground;
- a fourth inverter having an input connected to the drain terminals of the fourteenth and fifteenth transistors and receiving the third comparison signal, and an output that provides an inverted third comparison signal;
- an eighth resistor having a first terminal for receiving the supply voltage;
- a sixteenth transistor having a source terminal connected to a second terminal of the eighth resistor, a gate terminal for receiving the second comparator input signal, and a drain terminal for generating a fourth comparison signal;
- a seventeenth transistor having a drain terminal connected to the drain terminal of the sixteenth transistor, and a gate terminal for receiving the second comparator input signal;
- an eighteenth transistor having a drain terminal connected to a source terminal of the seventeenth transistor, a gate terminal for receiving the second bias voltage, and a source terminal connected to ground;
- a fifth inverter having an input connected to the drain terminals of the sixteenth and seventeenth transistors and receiving the fourth comparison signal, and an output that provides an inverted fourth comparison signal; and
- a sixth inverter having an input connected to the outputs of the fourth and fifth inverters and receiving the inverted third and fourth comparison signals, and an output that provides the second comparator output signal.

17. A relaxation oscillator for generating an output clock signal, comprising:
- a resistor-capacitor (RC) circuit for generating first and second comparator input signals;
- a bias generation stage for generating first and second bias voltages, including:
  - a reference voltage generator for generating a reference voltage using a supply voltage;
  - a first transistor having a source terminal for receiving the supply voltage;
  - a second transistor having a source terminal connected to a drain terminal of the first transistor, a gate terminal for receiving the reference voltage, and a drain terminal connected to a gate terminal of the first transistor for generating the first bias voltage;
  - a third transistor having a drain terminal connected to the drain terminal of the second transistor, and a gate terminal for receiving the reference voltage;
  - a first resistor having a first terminal connected to a source terminal of the third transistor and a second terminal connected to ground;
  - a second resistor having a first terminal for receiving the supply voltage;
  - a fourth transistor having a source terminal connected to a second terminal of the second resistor, a gate terminal for receiving the reference voltage, and a drain terminal for generating the second bias voltage;
  - a fifth transistor having a drain terminal connected to the drain terminal of the fourth transistor, and a gate terminal for receiving the reference voltage; and
  - a sixth transistor having a drain terminal connected to a source terminal of the fifth transistor, a gate terminal connected to the drain terminals of the fourth and fifth transistors, and a source terminal connected to ground;
- a first comparator stage, connected to the RC circuit, for generating a first comparator output signal based on the first comparator input signal, wherein the first comparator stage includes:
  - a seventh transistor having a source terminal for receiving the supply voltage, and a gate terminal for receiving the first bias voltage;
  - an eighth transistor having a source terminal connected to a drain terminal of the seventh transistor, a gate terminal for receiving the first comparator input signal, and a drain terminal for generating a first comparison signal;
  - a ninth transistor having a drain terminal connected to the drain terminal of the eighth transistor, and a gate terminal connected to the gate terminal of the eighth transistor for receiving the first comparator input signal;
  - a third resistor having a first terminal connected to a source terminal of the ninth transistor and a second terminal connected to ground;
  - a first inverter having an input connected to the drain terminals of the eighth and ninth transistors and receiving the first comparison signal, and an output that provides an inverted first comparison signal;
  - a fourth resistor having a first terminal for receiving the supply voltage;
  - a tenth transistor having a source terminal connected to a second terminal of the fourth resistor, a gate terminal for receiving the first comparator input signal, and a drain terminal for generating a second comparison signal;
  - a eleventh transistor having a drain terminal connected to the drain terminal of the tenth transistor, and a gate terminal for receiving the first comparator input signal;
  - a twelfth transistor having a drain terminal connected to a source terminal of the eleventh transistor, a gate terminal for receiving the second bias voltage, and a source terminal connected to ground;
  - a second inverter having an input connected to the drain terminals of the tenth and eleventh transistors and receiving the second comparison signal, and an output that provides an inverted second comparison signal; and
  - a third inverter having an input connected to the outputs of the first and second inverters and receiving the inverted first and second comparison signals, and an output that provides the first comparator output signal;

a second comparator stage, connected to the RC circuit, for generating a second comparator output signal based on the second comparator input signal, wherein the second comparator stage includes:
  a thirteenth transistor having a source terminal for receiving the supply voltage, and a gate terminal for receiving the first bias voltage;
  a fourteenth transistor having a source terminal connected to a drain terminal of the thirteenth transistor, a gate terminal for receiving the second comparator input signal, and a drain terminal for generating a third comparison signal;
  a fifteenth transistor having a drain terminal connected to the drain terminal of the fourteenth transistor, and a gate terminal connected to the gate terminal of the fourteenth transistor for receiving the second comparator input signal;
  a fifth resistor having a first terminal connected to a source terminal of the fifteenth transistor and a second terminal connected to ground;
  a fourth inverter having an input connected to the drain terminals of the fourteenth and fifteenth transistors and receiving the third comparison signal, and an output that provides an inverted third comparison signal;
  a sixth resistor having a first terminal for receiving the supply voltage;
  a sixteenth transistor having a source terminal connected to a second terminal of the sixth resistor, a gate terminal for receiving the second comparator input signal, and a drain terminal for generating a fourth comparison signal;
  a seventeenth transistor having a drain terminal connected to the drain terminal of the sixteenth transistor, and a gate terminal for receiving the second comparator input signal;
  a eighteenth transistor having a drain terminal connected to a source terminal of the seventeenth transistor, a gate terminal for receiving the second bias voltage, and a source terminal connected to ground;
  a fifth inverter having an input connected to the drain terminals of the sixteenth and seventeenth transistors and receiving the fourth comparison signal, and an output that provides an inverted fourth comparison signal; and
  a sixth inverter having an input connected to the outputs of the fourth and fifth inverters and receiving the inverted third and fourth comparison signals, and an output that provides the second comparator output signal; and
a logic circuit that receives the first and second comparator output signals and generates a first intermediate signal and the output clock signal.

18. The relaxation oscillator of claim 17, wherein the logic circuit comprises:
  a first NAND gate having a first input terminal connected to an output terminal of the first comparator stage for receiving the first comparator output signal, a second input terminal for receiving a second intermediate signal, and an output terminal connected to the RC circuit, wherein the first NAND gate generates the first intermediate signal at the output terminal thereof and transmits the first intermediate signal to the RC circuit;
  a second NAND gate having a first input terminal connected to an output terminal of the second comparator stage for receiving the second comparator output signal, a second input terminal connected to the output terminal of the first NAND gate for receiving the first intermediate signal, wherein the second NAND gate generates the second intermediate signal at an output terminal thereof; and
  a NOT gate having an input terminal connected to the output terminal of the first NAND gate for receiving the first intermediate signal, and an output terminal connected to the RC circuit, wherein the NOT gate generates the output clock signal at the output terminal thereof and transmits the output clock signal to the RC circuit.

* * * * *